United States Patent
Yang et al.

(10) Patent No.: US 7,239,852 B2
(45) Date of Patent: Jul. 3, 2007

(54) ASYMMETRIC, OPTIMIZED COMMON-SOURCE BI-DIRECTIONAL AMPLIFIER

(75) Inventors: Jeffrey Ming-Jer Yang, Cerritos, CA (US); Matt Nishimoto, Torrance, CA (US); Yun-Ho Chung, Redondo Beach, CA (US); Michael Battung, Torrance, CA (US); Richard Lai, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 648 days.

(21) Appl. No.: 10/632,683

(22) Filed: Aug. 1, 2003

(65) Prior Publication Data

US 2005/0026571 A1 Feb. 3, 2005

(51) Int. Cl.
    *H04B 1/44* (2006.01)
(52) U.S. Cl. .................. 455/78; 455/127.1; 455/127.2; 330/54; 330/286
(58) Field of Classification Search .................. 455/78, 455/127.1, 127.2, 73, 114.3, 194.2, 341; 330/54, 286, 277
See application file for complete search history.

(56) References Cited

U.S. PATENT DOCUMENTS

| | | |
|---|---|---|
| 4,054,837 A | 10/1977 | Hibbs, Jr. et al. |
| 4,390,851 A | 6/1983 | Higgins et al. |
| 4,758,822 A | 7/1988 | Greaby et al. |
| 4,890,069 A | 12/1989 | Duffalo et al. |
| 5,105,161 A | 4/1992 | Takami et al. |
| 5,105,166 A | 4/1992 | Tsukii et al. |
| 5,296,762 A | 3/1994 | Hanson et al. |
| 5,414,387 A * | 5/1995 | Nakahara et al. ............. 330/54 |
| 5,821,813 A | 10/1998 | Batchelor et al. |

FOREIGN PATENT DOCUMENTS

| | | |
|---|---|---|
| EP | 0 883 241 A1 | 12/1998 |
| EP | 1 202 447 A1 | 5/2002 |
| JP | 0 634836 * | 1/1995 |

OTHER PUBLICATIONS

JM Yang et al, GaAs Bi-Directional Amplifier for Low Cost Electronic Scanning Array Antenna; IEEE GaAs Digest; Apr. 2003, pp. 129-130; USA.

* cited by examiner

*Primary Examiner*—Matthew D. Anderson
*Assistant Examiner*—Sanh Phu
(74) *Attorney, Agent, or Firm*—LaRiviere, Grubman & Payne, LLP

(57) ABSTRACT

A common source, bi-directional microwave amplifier is described. More particularly, the present invention is a microwave, common source, bi-directional amplifier that includes a first amplification path and a second amplification path wherein the signal directional flow is controlled through the selective biasing of the first amplification path and the second amplification path. Each amplification path is designed to optimize desired performance. For signal flow through the first amplification path, the first amplification path is biased-on and the second path is biased-off. For signal flow through the second amplification path, the second amplification path is biased-on and the first path is biased-off.

14 Claims, 8 Drawing Sheets

ASYMMETRIC, OPTIMIZED COMMON-SOURCE BI-DIRECTIONAL AMPLIFIER

FIELD OF THE INVENTION

The present invention relates to a bi-directional signal flow amplifier for electronic systems. More particularly, the present invention relates to bi-directional signal flow amplifier topology having a high power transmitter amplifier path for a high level transmit signals and a low noise receive amplifier path for a low level receive signal for electronic systems.

DESCRIPTION OF THE PRIOR ART

Radio frequency and microwave communication systems receive and transmit signals to and from a multiplicity of clients. Electronic systems require electronic hardware such as amplifiers for various signal applications such as low noise signal operation and/or high output power signal operation. Some examples of electronic systems include radar and communication systems. During low noise signal operation, the amplifier boosts the signal gain of weak, low level signals while minimally increasing the system noise figure. During high power signal operation, the amplifier boosts the signal level while maintaining a high output power level. As such, amplifiers are utilized in strategic locations within the communication system hardware to compensate for signal losses associated with interconnections between elements, i.e., passive losses caused by finite transmission line lengths, and/or other passive and active connections between an input signal port and an output signal output.

For radar and communication systems applications, amplifiers are typically coupled to at least one antenna array. In general, a radar system or a communication system includes at least one antenna to receive and transmit signals. In the receive mode, the antenna spatially scans for signals by steering the antenna radiation beam pattern, and locks onto a desired signal. An antenna comprising an amplitude excited and/or phase excited array may be used to form receive beams to search for an incoming signal. The amplitude and/or phase excited array may also shape transmit beams to provide a high signal strength in the direction of a client. One example of such an array antenna is a phased array.

The phased array includes a plurality of spaced apart radiating elements. Each of the radiating elements may be independently controlled to radiate electromagnetic energy in a desired direction and to form a desired beam shape. Each of the radiating elements are provided signals having a selected phase and an amplitude excitation relative to one another for signal transmission, and receive signals from each element are processed to modify the phase and amplitude of each signal for signal reception. The amplitude excitation of the radiating elements may be used to control the beam shape and the sidelobe level. One method to control the beam shape and the sidelobe level is to utilize a transceiver circuit for each radiating element, i.e., a circuit containing both transmit and receive signal capability. Such transceiver circuit must include the capability to switch between a high power transmit mode and a low noise receive mode. The transceiver circuit will normally include two amplifiers comprising a transmitter amplifier for high power amplification and a receive amplifier for low noise amplification, where the signals forming the transmit or the receive beam respectively, are steered via switches through the transmitter amplifier or the receiver amplifier. It would be desirable to eliminate one of these amplifiers. Additionally, it would be desirable for the transmitter amplifier to be coupled near each antenna element to minimize noise figure in the receive mode and to maximize output power in the transmit mode.

In the prior art, an integrated amplifier has been fabricated in one Monolithic Microwave Integrated Circuit (MMIC) chip containing all the basic transmit and receive functions: switching, high power amplification and low noise power amplification. The integrated amplifier processes the transmit and receive signals for a phased array. The phased array contains many hundreds of radiating elements each associated with an individual integrated amplifier, and eliminates the need for separately mounting and combining individual functional blocks, (i.e. two amplifiers, and two switches, for each radiating element). The elimination of separate function blocks decreases the part count and improves yield and reliability because amplifiers with high part counts complicate the manufacturing process and usually lead to a low mean time to failure and rework.

However, the typical integrated amplifier approach is not as effective as individual functional blocks because Radio Frequency (RF) signal routing by RF switches within a single integrated amplifier usually results in increased insertion loss in both the RF transmit and the RF receive paths, causing increased noise figure for the receive mode, and loss in output power and power efficiency in the transmit mode.

Bi-directional amplifiers have been known to be used in various microwave and RF applications. There are two distinct types of bi-directional amplifier. The first type is a passive RF signal switching topology that is taught in: U.S. Pat. No. 4,054,837 which discloses a bi-directional amplifier utilizing a pair of parallel diodes to control the RF signal flow between the receiver amplifier and the transmitter amplifier; U.S. Pat. No. 4,758,822 which discloses a bi-directional amplifier utilizing a pair of interconnected bridge circuits including isolation transformers to control signal flow; and U.S. Pat. No. 5,296,762 which discloses a bi-directional amplifier comprising a plurality of diodes located in a ring structure electrically connected to an amplifier to be switched. All bi-directional amplifiers featuring passive RF switching topologies have disadvantages, including increased insertion loss, resulting in increased noise figure in the receive path and decreased output power in the transmit path.

The second type is an active RF signal steering topology taught in: U.S. Pat. No. 5,821,813 which discloses a bi-directional amplifier that is connected in the common gate mode, and U.S. Pat. No. 5,105,166 which discloses a bi-directional amplifier that is a symmetrical matrix amplifier that has pairs of RF input terminals and pairs of RF output terminals. However, prior art active RF signal steering topologies also have disadvantages which include amplifiers not designed for optimal high power or low noise applications, and amplifiers having pairs of input and output terminals. Thus, the present active RF signal steering configuration is a compromise between low noise and high power. As a result, the designer is constrained to one of the following combinations: optimal performance for the low noise amplifier, optimal performance for the transmitter for high power applications, or an amplifier design that is set somewhere between optimal achievable low noise and high power performance.

Thus, there is a need for a bi-directional amplifier suitable for transmit and receive applications that does not include switching circuits which introduce insertion loss, does not include steering circuits which compromise optimum design criteria, and is optimized for low noise operation in the receive mode, and high power performance in the transmit mode.

BRIEF SUMMARY OF THE INVENTION

The present invention is a bi-directional amplifier for electronic systems such as radar and communications systems. More particularly, the present invention is a microwave, common source, bi-directional amplifier that includes a first amplification path and a second amplification path wherein the signal directional flow is controlled through the selective biasing of the first amplification path and the second amplification path. Each amplification path is designed to optimize desired performance. For high power performance, the amplification path may be designed with optimized input and output matching networks, interstage impedance matching networks and biased for high power amplification. For low noise performance, the amplification path is designed with optimized input and output matching networks, interstage impedance matching networks and biased for low noise amplification. For signal flow through the first amplification path, the first amplification path is biased-on and the second amplification path is biased-off. For signal flow through the second amplification path, the second amplification path is biased-on and the first amplification path is biased-off.

In one embodiment, the present invention is a bi-directional amplifier comprising a first port and a second port, a receiver amplifier, and a transmitter amplifier, both electrically connected between the first port and the second port, wherein the receiver amplifier directionally couples a signal from the second port to the first port during a receive mode and the transmitter amplifier is biased off during that mode. Further, the transmitter amplifier directionally couples a signal between the first port and the second port during the transmit mode and the receiver amplifier is off during that mode.

DESCRIPTION OF DRAWINGS

For a better understanding of the present invention, reference is made to the below-referenced accompanying drawings. Reference numbers refer to the same or equivalent parts of the present invention throughout the several figures of the drawings.

DETAILED DESCRIPTION OF THE INVENTION

Figure 1A:
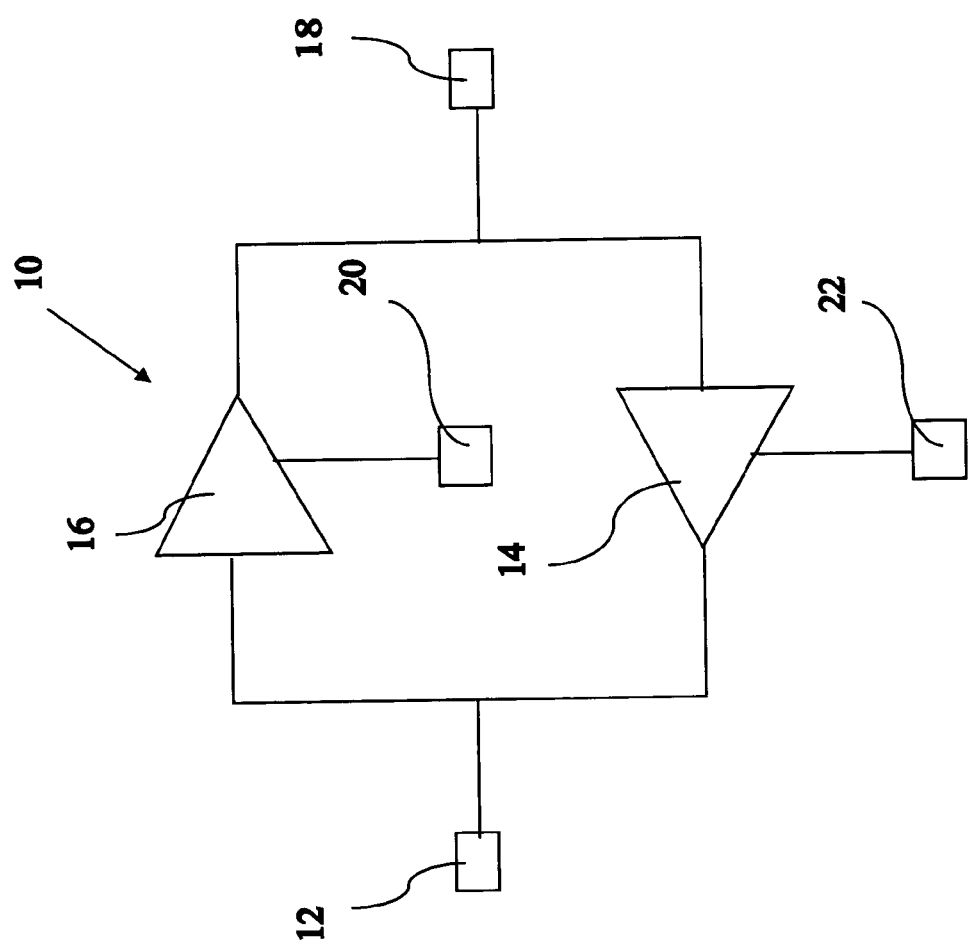
FIG. 1A is a block diagram of a bi-directional amplifier in accordance with the present invention.

Referring particularly to FIG. 1A, a block diagram of a bi-directional amplifier 10 of the present invention is shown, which bi-directional amplifier 10 includes a first mode and a second mode. Further, bi-directional amplifier 10 includes a first amplification path and a second amplification path. For purposes of describing the present invention, said first mode is a receive mode, said second mode is a transmit mode, said first amplification path is a receiver amplifier 14, and said second amplification path is a transmitter amplifier 16. Further, it shall be noted that the present invention may include any first amplification path and any second amplification path and should not be limited to receiver amplifier 14 and transmitter amplifier 16.

In addition, bi-directional amplifier 10 comprises a first port 12, a second port 18, a receiver electrode 22, and a transmitter electrode 20. Receiver electrode 22 and transmitter electrode 20 controls the direction of a signal flowing through amplifier 10, and thus the mode of amplifier 10. The signal being amplified is an electrical signal such as an RF, Microwave, or Millimeter wave signal. In the receive mode, receiver electrode 22 is a high voltage value and transmitter electrode 20 is a low voltage value, which results in a receive signal path from the second port 18 to the first port 12 via receiver amplifier 14. In the transmit mode, receiver electrode 22 is at a low voltage value and transmitter electrode 20 is a high value, resulting in a transmit signal path from the first port 12 to the second port 18 via amplifier 16. Thus, the voltage value of receiver electrode 22 and transmitter electrode 20 determines the transmit mode or the receive mode of bi-directional amplifier 10.

Figure 1B:
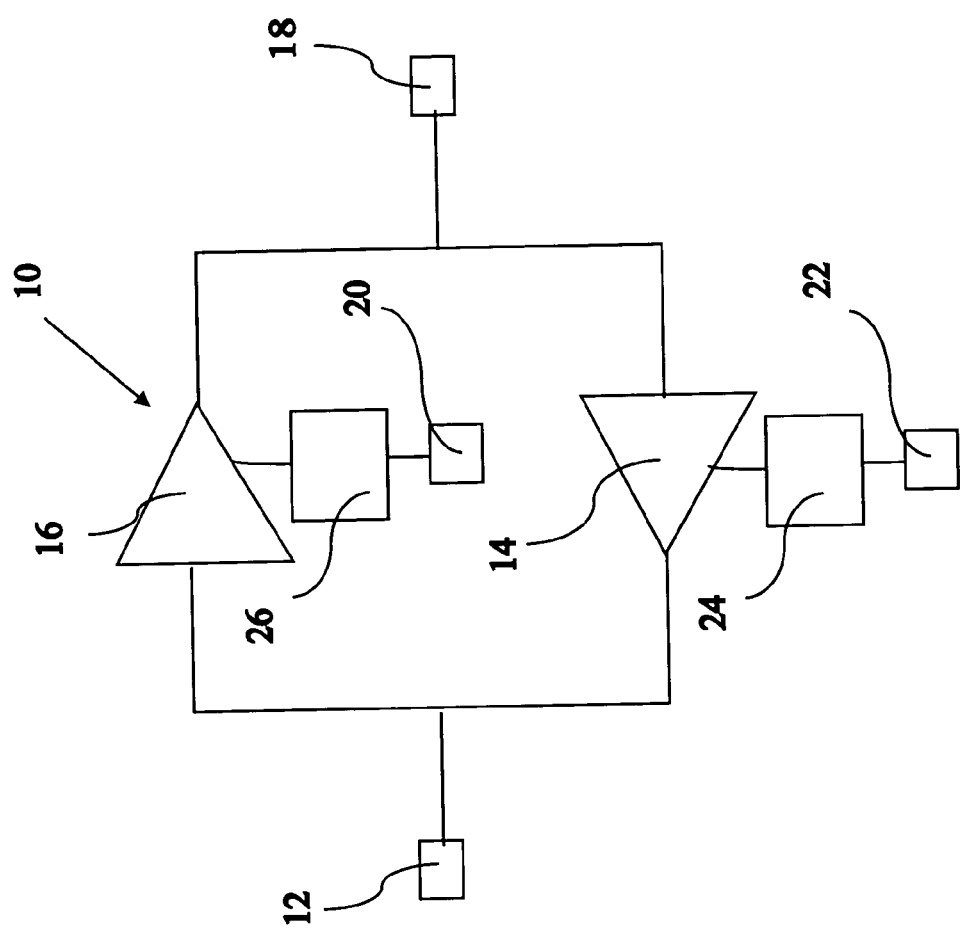
FIG. 1B is a block diagram of a bi-directional amplifier with bias networks in accordance with the present invention.

As shown in FIG. 1B, bi-directional amplifier 10 additionally comprises one or more bias networks 24 and 26. Transmitter electrode 20 provides dc current and voltage to bias network 26 to bias transmitter amplifier 16. Receiver electrode 22 provides dc current and voltage to the bias network 24 to bias receiver amplifier 14. Bias networks 24 and 26 may be resistive divider circuits. Bias network 24 is adapted to present a low noise bias condition to receiver amplifier 14 by providing a low voltage level to receiver amplifier 14. Conversely, bias network 26 is adapted to present a high output power condition to transmitter amplifier 16.

Figure 2:
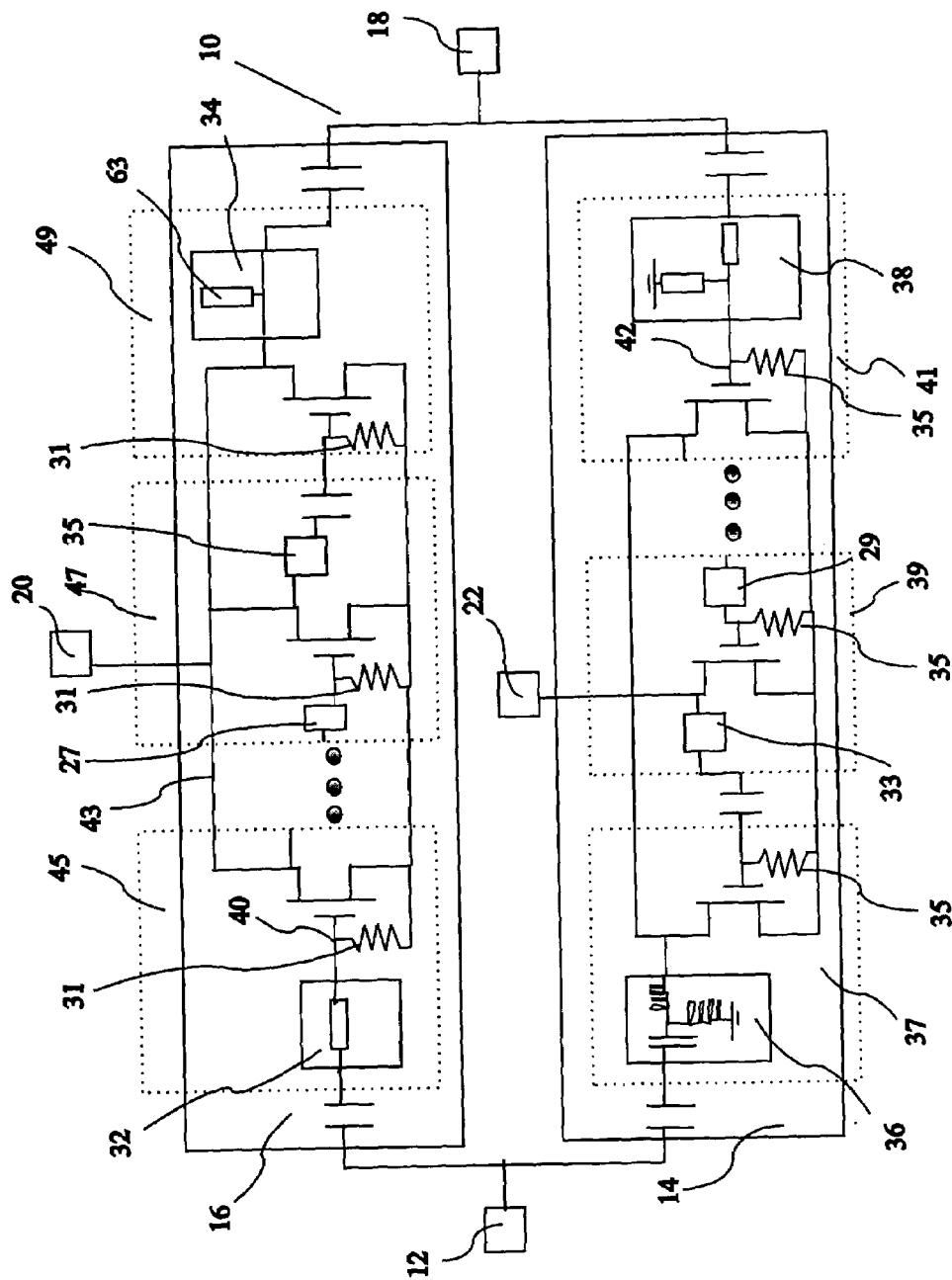
FIG. 2 is a schematic diagram of a bi-directional amplifier used in a transceiver module for use in a phased array antenna in accordance with the present invention.

Referring particularly to FIG. 2, a schematic diagram is shown for bi-directional amplifier 10 according to the present invention. Bi-directional amplifier 10 is suitable for use in a transceiver module coupled with a phased array antenna. Bi-directional amplifier 10 comprises a first port 12, a transmitter amplifier 16, a receiver amplifier 14, a second port 18, a receiver electrode 22, and a transmitter electrode 20. First port 12 serves a dual function; namely, the first port 12 functions as a transmitter input port and a receiver output port. Second port 18 also serves a dual function; namely, it functions as a receiver input port and a transmitter output port. For example, when transmitter electrode 20 is biased to activate transmitter amplifier 16 and receiver electrode 22 is biased to turn-off the receiver amplifier 14, first port 12 functions as a transmitter input port and second port 18 functions as a transmitter output port. In this instance, the signal flows from the first port 12, is amplified by transmitter amplifier 14, and output through second port 18.

When transmitter electrode 20 is biased to deactivate transmitter amplifier 16 and receiver electrode 22 is biased to activate receiver amplifier 14, first port 12 functions as the receiver output port and second port 18 function as the receiver input port. In this case, the signal flows from second port 18, is amplified by receiver amplifier 14, and output through first port 12.

Transmitter amplifier 16 includes an input matching network 32 that is designed for high power amplification, and an output matching network 34 that is designed for high output power. Transmitter amplifier 16 comprises a three stage FET amplifier circuit. Each FET has at least one gate terminal, at least one drain terminal, and a source terminal. However, it should be noted that the present invention may also include the addition of matching networks between each FET stage, i.e., interstage matching 27, 35, and the amplifier 10 may include more or less than three stages 45, 47, 49 of FET amplification. Additionally, it should be noted that other active devices may be substituted for the FETs such as Bipolar Junction Transistors (BJT), High Electron Mobility Transistors (HEMT), Complementary Metal Oxide Semiconductor (CMOS) devices, or generally other active devices having current gain and/or voltage gain. Input and output matching networks 32 and 34 respectively may be implemented as low pass, bandpass, or high pass matching networks.

Transmitter amplifier 16 is self-biased using a resistive voltage divider network 31. If the FET is a depletion mode HEMT power process device to maximize transmitter output power, gate 40 is biased near 0 volts and drain 42 such that the output voltage swing does not result in the gate to drain voltage exceeding breakdown conditions. The FET may be a common source amplifier with a grounded source terminal. In the alternative, a BJT active device may replace the FET with a grounded emitter terminal. Typically, the output matching network of a power amplifier may be a low impedance series transmission line or a low impedance shunt capacitance or an open circuit transmission line stub. In FIG. 2, open circuit stub 63 is utilized to transform the low output impedance of the power amplifier to a higher, more easily manageable impedance as well as provide isolation between the amplifying FETs. In addition, transmitter amplifier output matching network 34 to achieve maximum output power accounts for the off-state capacitance of receiver amplifier 14 shut-off state reactive, resistive, and parasitic components, i.e., off-state capacitance, series inductance, or parasitic resistance within receiver amplifier 14 FETs being shut-off. The particular advantage of this topology is that the bias network and the input and the output matching networks for transmitter amplifier 16 are designed for maximum output power transfer. The design of the bias and matching network for amplifier 16 take account of the reactive, resistive, and parasitic components of receiver amplifier 14 when it is shut off.

Receiver amplifier 14 includes low noise input matching network 38 and an output matching network 36 optimized for a low noise response. Receiver amplifier 14 comprises a three stage Field Effect Transistor (FET) amplifier design. Each FET has at least one gate terminal, at least one drain terminal, and a source terminal. However, it should be noted that other active devices may be substituted for the FET such as Bipolar Junction Transistor (BJT), High Electron Mobility Transistors (HEMT), Complementary Metal Oxide Semiconductor (CMOS) devices, or generally other active devices having current gain and/or voltage gain. With continuing reference to FIG. 2, it should be noted that the present invention may also include the addition of interstage matching networks between each FET stage, e.g., interstage matching 29, 33, and amplifier 10 may include stages 41, 39, 37 of FET amplification. Input and output matching networks 38 and 36 may be implemented as low pass, bandpass, or high pass matching network topologies.

Receiver amplifier 14 may be self-biased using a resistive voltage divider network 35. If the FET is a depletion mode HEMT power process device, to minimize a receiver noise figure, the gate 42 may be biased to approximately −1.5 to approximately −2.0 volts. In this example, the FET may have a grounded source terminal. In the alternative, a BJT device may replace the FET with a grounded emitter terminal. Typically, the input matching network 38 of a low noise amplifier comprises a matching network which realizes a minimum noise reflection coefficient, i.e., $r_{min}$, may comprise a series transmission line and optionally a short-circuited transmission, or any other distributed or lumped reactive matching element implementation to minimize the noise figure reflection coefficient for the chosen FET device.

In addition, receiver amplifier input matching network 38 to achieve the minimum noise figure accounts for off-state capacitance of the mth, i.e. final FET stage, and other intrinsic and extrinsic parasitic elements of the mth FET produced when the transmitter amplifier 16 is shut-off. Thus, the particular advantage of this topology is that the bias network, and the input 38 and the output matching networks 36 are designed to minimize noise figure including transmitter amplifier 16 shut-off state reactive, resistive, and parasitic components. Therefore, both transmitter amplifier 16 designed for high power output and the receiver amplifier 14 designed for a low noise figure may have different circuit topologies, and differing matching component values for inductors, resistors, capacitors, transmission line lengths. Therefore, the matching networks may be different, i.e. asymmetrical, for transmitter amplifier 16 and receiver amplifier 14, respectively.

Figure 3:
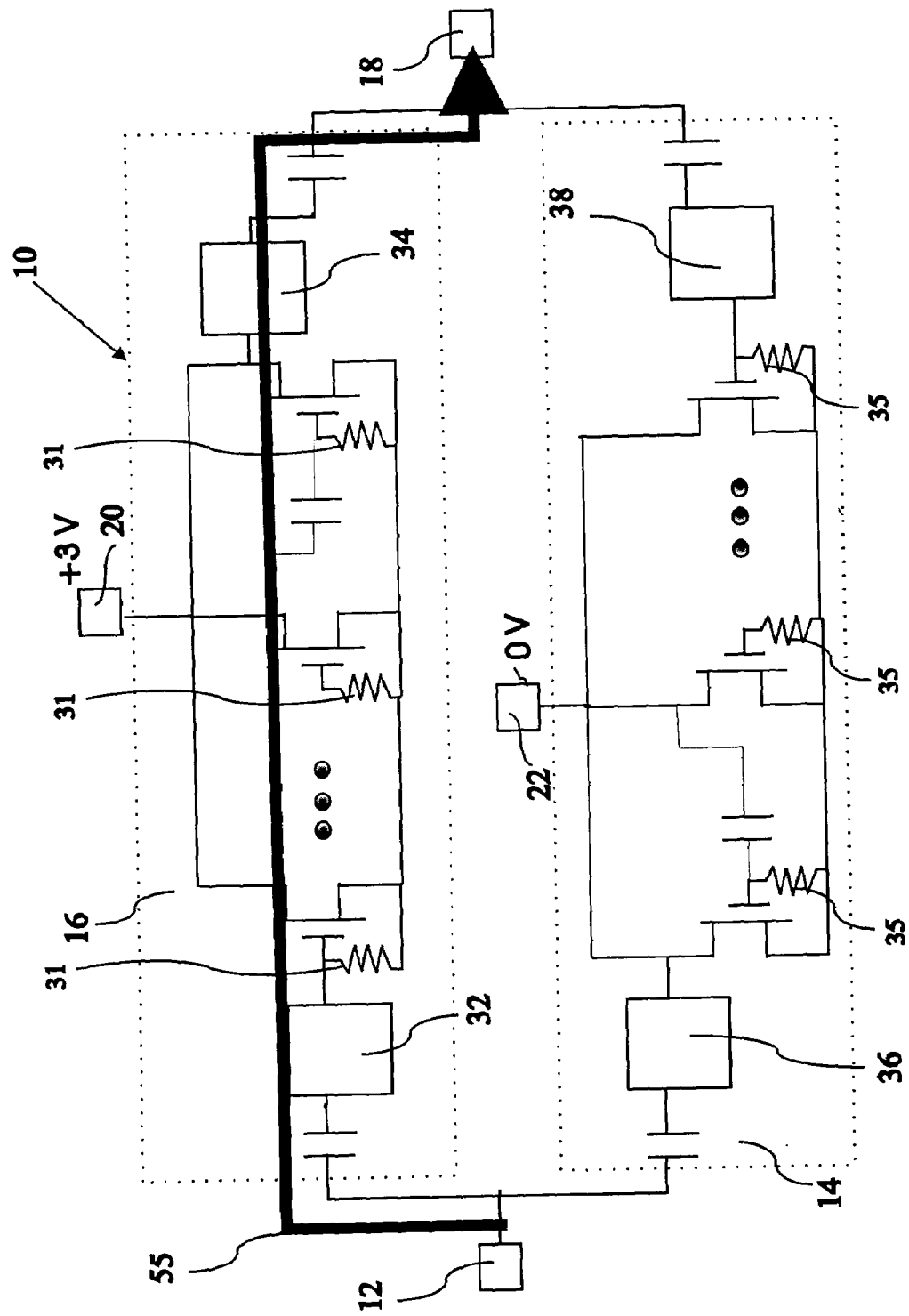
FIG. 3 is a schematic diagram of a bi-directional amplifier when utilized in the transmit mode in accordance with the present invention.

Referring particularly to FIG. 3, a schematic diagram of bi-directional amplifier 10 operating in the transmit mode is shown. Bias network 31 is adapted to present a high output power condition to transmitter amplifier 16. During the transmit mode, transmitter electrode 20 is connected to a high voltage value. As shown, transmitter electrode 20 is connected to a high voltage value of approximately 3 volts to approximately 5 volts to activate transmitter amplifier 16, directionally coupling the signal along signal path 55 from first port 12 to the second port 18. In the transmit mode, receiver electrode 22 is grounded.

Figure 4:
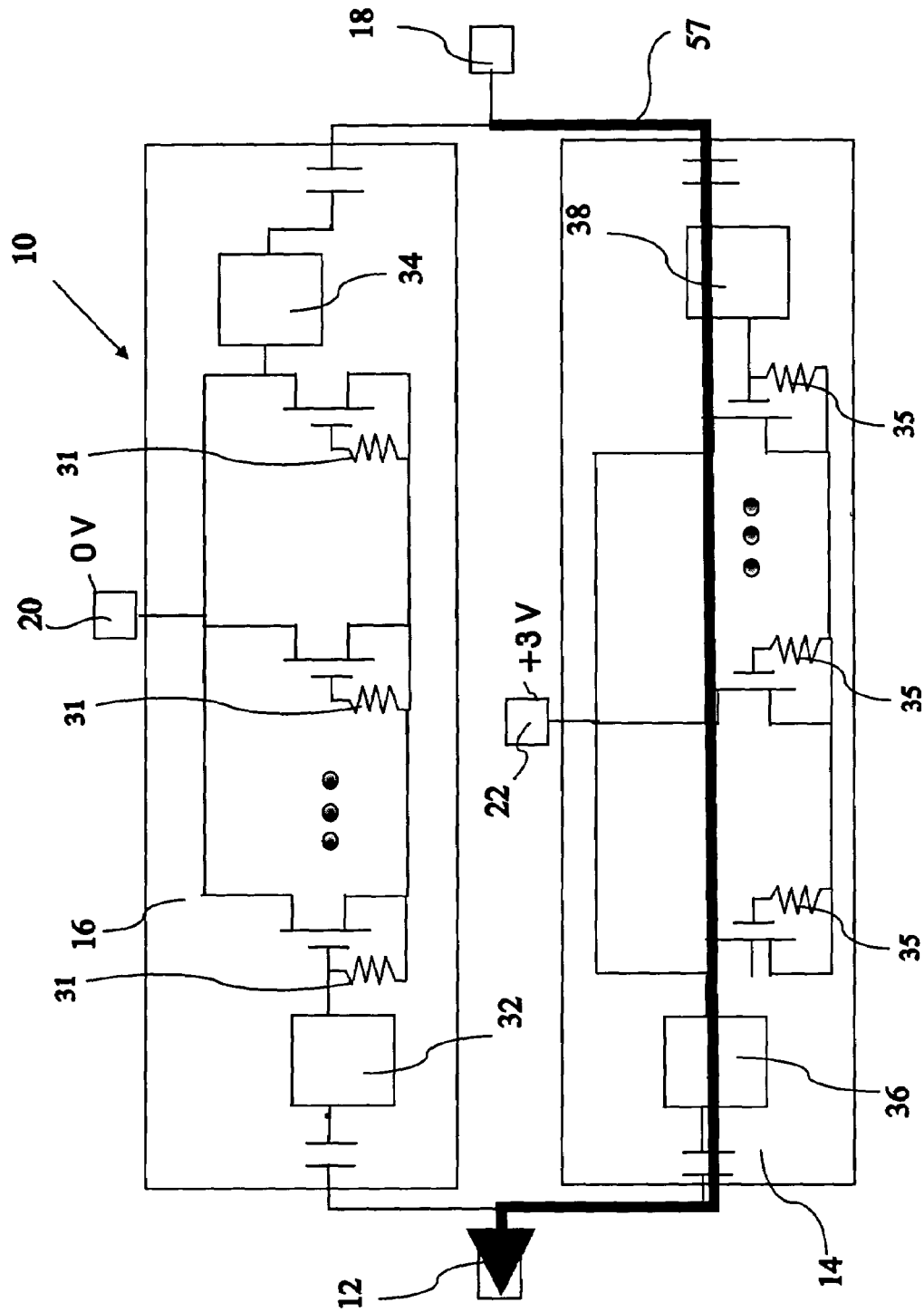
FIG. 4 is a schematic diagram of a bi-directional amplifier when utilized in the receive mode in accordance with the present invention.

Referring particularly to FIG. 4, a schematic diagram of bi-directional amplifier 10 operating in the receive mode is shown. Bias network 35 is adapted to present a high output power condition to the receiver amplifier 14. During the receive mode, receiver electrode 22 is connected to a high voltage value. As shown, transmitter electrode 20 is connected to a low voltage value and the receiver electrode is connected to a voltage of approximately 3 volts to approximately 5 volts to activate receiver amplifier 14, directionally coupling the signal along signal path 57 from first port 12 to second port 18. In the receive mode, transmitter electrode 20 is grounded.

Figure 5A:
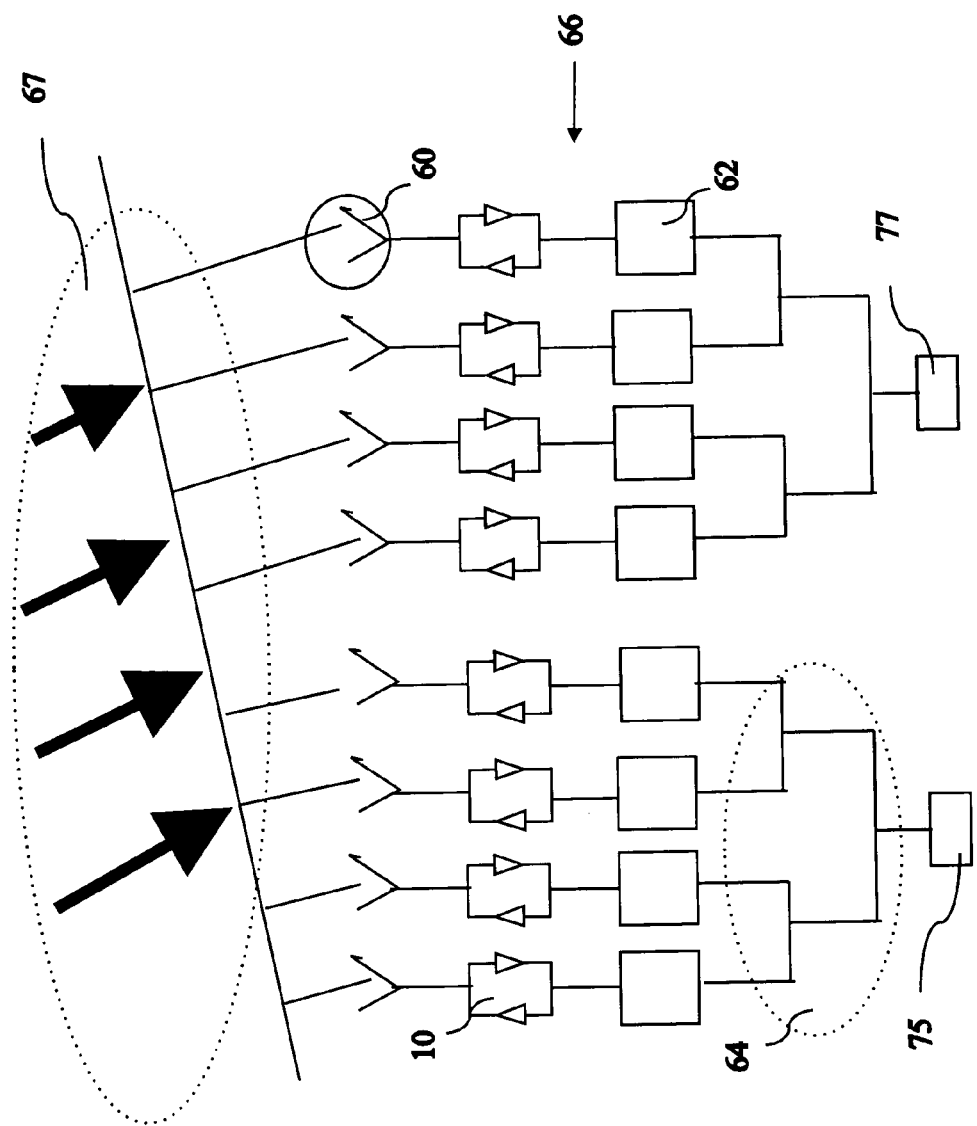
FIG. 5A is a schematic diagram of a bi-directional amplifier in the receive mode used as part of a linear phased array in accordance with the present invention.

Referring particularly to FIG. 5A, a schematic diagram of the bi-directional amplifier 10 is shown as part of a phased array 66. A linear phased array allows the user to control the beam shape and sidelobe levels for a radiated antenna pattern by electronically controlling the phase and the amplitude of each of its radiating elements 60. In this implementation, incoming signal wavefront 67 received by each radiating element 60 of phased array 66 is electrically coupled to one bi-directional amplifier 10 and optionally electrically coupled to a phase shifter 62. For instance, a radiating element 60 may be a microstrip patch or a horn antenna. In the receive mode, each bi-directional amplifier 10 provides low noise signal amplification directly at each radiating element 60. Thus, by having the bi-directional amplifier 10 with a low noise figure, and amplitude gain to overcome losses between radiating element 60 and bi-directional amplifier 10 and in any adjoining combining matrix 64 electrically coupled to radiating element 60, the received input signal to noise performance is minimally degraded, thereby allowing faint received signals to be recovered. In addition, because each radiating element 60 is coupled bi-directional amplifier 10, the amplitude excitation of each radiating element 60 may be individually controlled to control the phased array beam shape and sidelobe level. Optionally, a combining matrix 64 having matrix output ports 75, 77 may be utilized.

Figure 5B:
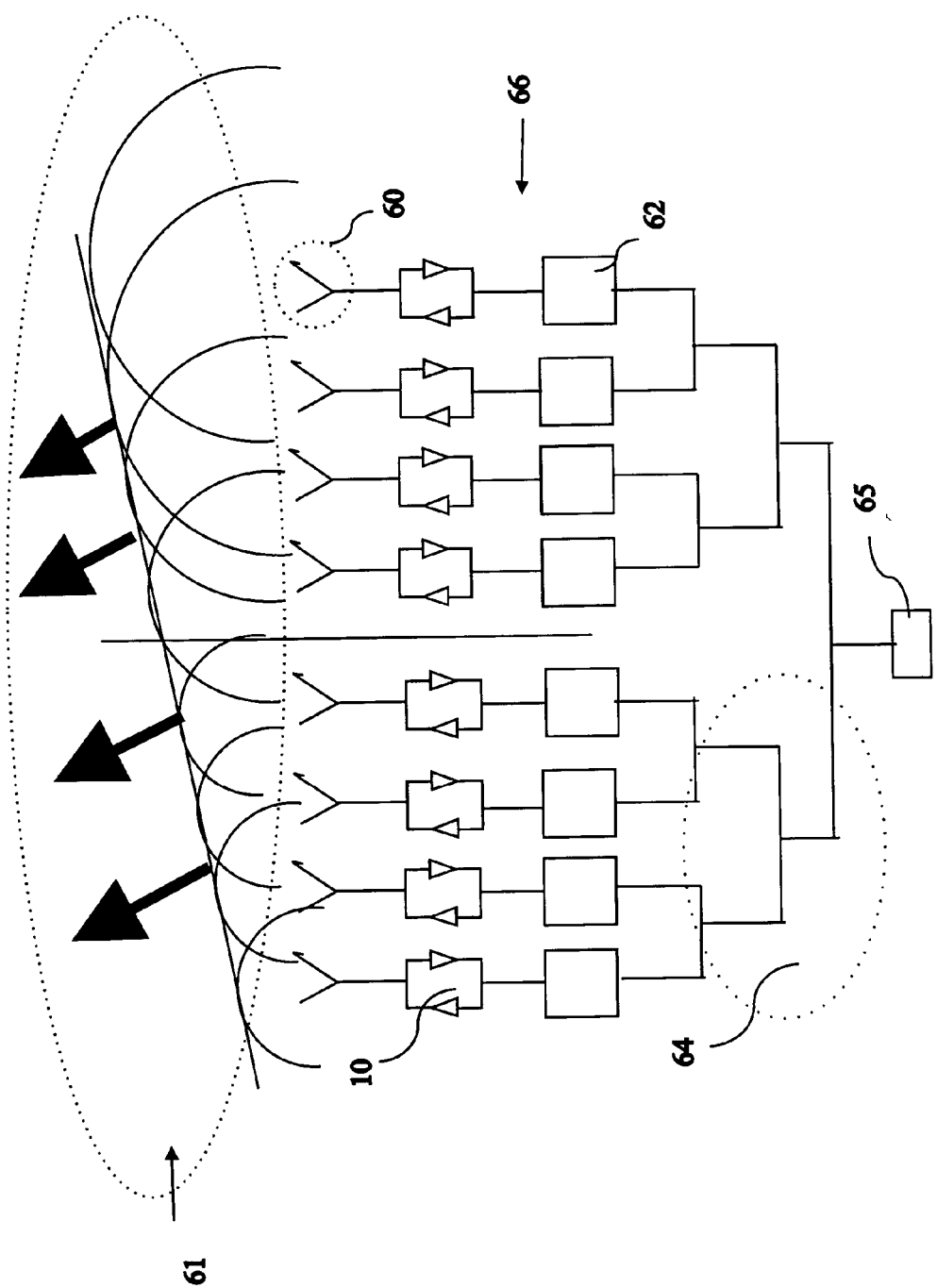
FIG. 5B is a schematic diagram of a bi-directional amplifier in the transmit mode used as part of a linear phased array in accordance with the present invention.

Referring to FIG. 5B, in the transmit mode, bi-directional amplifier 10 in the high power transmit mode allows the transmit signal 65 to be boosted before transmitted as an output signal wavefront 61. Further, if the phased array 66 is completely fabricated on a Monolithic Microwave Integrated Circuit (MMIC) semiconductor wafer including radiating elements 60 coupled to bi-directional amplifier 10 and optionally phase shifter 62, produces a low cost phased array 66. Optionally, a combining matrix 64 having matrix output ports 65, 77 may be utilized. Additionally, because bi-directional amplifier 10 is after the combining matrix 64 where combining matrix 64 is lossy, a smaller periphery, i.e., smaller area active device, bi-directional amplifier 10 with lower dc power consumption may be utilized because bi-directional amplifier 10 being proximal to radiating element 60 minimizes insertion loss.

As a result, an array 66 will result having low noise performance while preserving long distance signal transmit capability with a smaller device periphery FET device amplifier. Further, because each bi-directional amplifier 10 MMIC plus optional phase shifter 62 occupies about a 1.2 mm by a 1.2 mm area, a complete MMIC phased array 66 operating about 35 Gigahertz (GHz) may be produced with hundreds of microstrip patches and occupy only an approximately a 3 inch square area on a 4 mil thick semiconductor wafer. Thus, one of the many advantages of an all MMIC phased array is a reduced size while achieving large aperture performance. Another advantage is that the phased array 66 containing hundreds of radiating elements 60 would be low cost because all of the basic transceiver functions, i.e., transmit and receive amplification, are achieved using one small MMIC amplifier.

Figure 6:
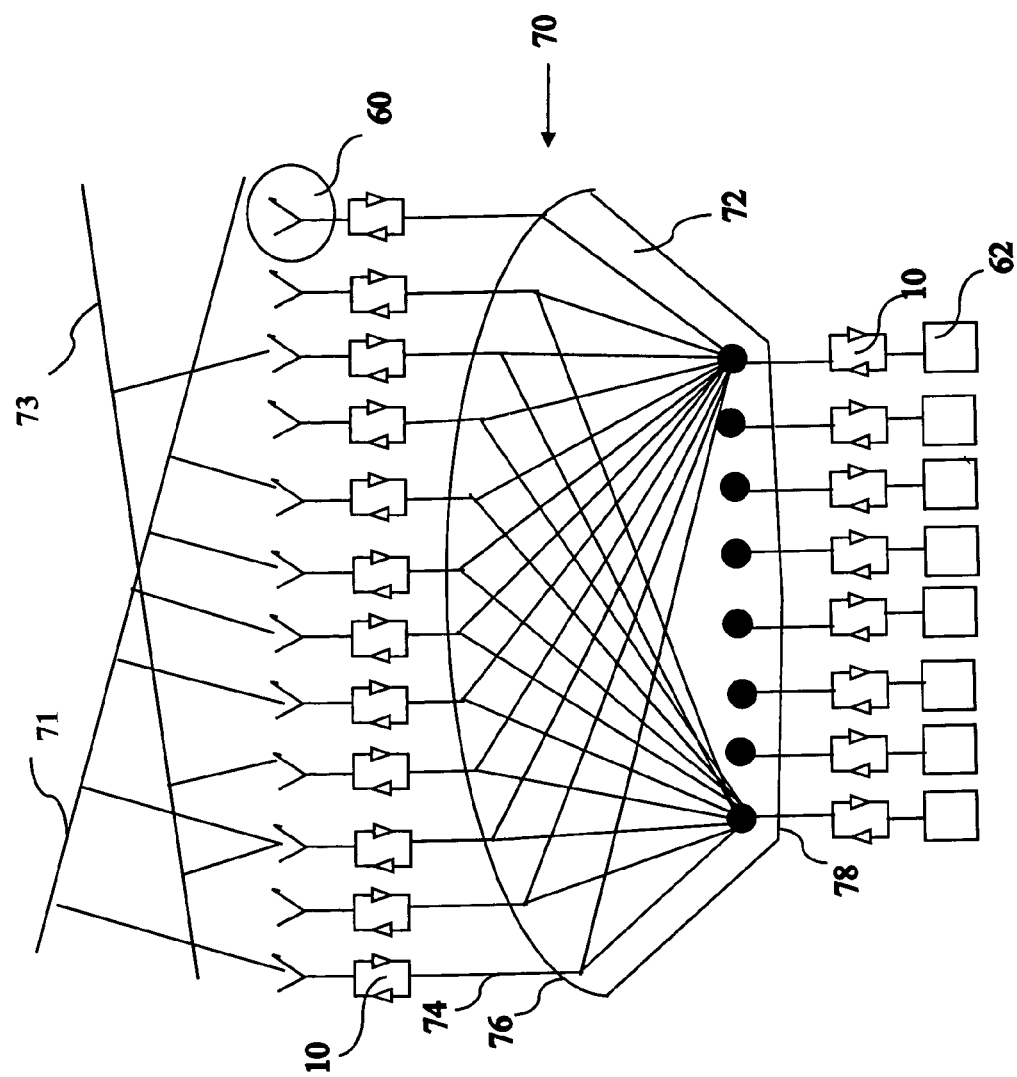
FIG. 6 is a schematic diagram of a bi-directional amplifier used as part of a Rotman Bootlace Lens matrix array in accordance with the present invention.

Referring to FIG. 6, a schematic diagram of bi-directional amplifier 10 used as part of a Rotman Bootlace Lens matrix array 70 is shown. Another method for transmitting and receiving RF energy to and from an array of radiating elements 60 is to use a lens such as Rotman Bootlace Lens 72. Rotman Lens 72 comprises an array port side 76 where the radiating elements are attached, and a beam port side 78 where bi-directional amplifier 10 is attached. Lens 72 comprises a large flat plate center conductor sandwiched between two ground planes with individual waveguide-to-microstrip launches 74 where the tapered launches transition the impedance from beam port side 78 to array port side 76. If array 70 is in the receive mode, the incoming signal wavefronts 71, 73 intercepted on the array port side 76 is controlled by the angle subtended by the tapered sections of the connector launches much like a larger antenna. The main advantage of using Rotman Bootlace Lens 72 is to provide true time delay phase shift and amplitude tapering in one lens component where the true time delay and beam steering is independent of frequency.

Information as herein shown and described in detail is fully capable of attaining the above-described object of the invention, the present preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, one skilled in the art should recognize that various changes and modifications in form and material details may be made without departing from the spirit and scope of the inventiveness as set forth in the appended claims. No claim herein is to be construed under the provisions of 35 U.S.C. § 112, sixth paragraph, unless the element is expressly recited using the phrase "means for."

What is claimed is:

1. A bi-directional amplifier having a first mode and a second mode comprising:
   a first port;
   a second port;
   a first amplification path electrically connected between the second port and the first port, biased to directionally couple a signal from the second port to the first port during the first mode and biased off during the second mode;
   a second amplification path electrically connected between the first port and the second port, biased to directionally couple a signal from the first port to the second port during the second mode and biased off during the first mode;
   said first mode is a receive mode and said first amplification path is a receiver amplifier which further comprises an input matching network and an output matching network for optimizing said receiver amplifier noise figure;
   said second mode is a transmit mode and said second amplification path is a transmitter amplifier, which is optimized for high power, further comprising a transmitter electrode that is biased at a high voltage potential when the transmitter amplifier is in the transmit mode;
   said transmitter amplifier further comprises an input matching and output matching network, and said receiver input and output matching networks topologies are asymmetrical to said transmitter input and output matching networks.

2. A bi-directional amplifier in accordance with claim 1, wherein said first amplification path is a common source amplifier.

3. A bi-directional amplifier in accordance with claim 1, wherein said second amplification path is a common source amplifier.

4. A bi-directional amplifier in accordance with claim 1, wherein said receiver amplifier is optimized for low noise, and further comprises a receiver electrode which is biased at a high voltage potential when the receiver amplifier is in the receive mode.

5. A bi-directional amplifier in accordance with claim 1, wherein said receiver amplifier further comprises interstage matching networks optimized for low noise figure and said transmitter amplifier further comprises interstage matching networks optimized for high power output.

6. A phased array system comprising:
a plurality of radiating elements;
at least one bi-directional amplifier;
wherein said at least one bi-directional amplifier comprises:
a first port;
a second port;
a receiver amplifier electrically connected between the second port and the first port and optimized for low noise, biased to directionally couple a signal from the second port to the first port during the receive mode and biased off during the transmit mode; and
a transmitter amplifier electrically connected between the first port and the second port and optimized for high power, biased to directionally couple a signal from the first port to the second port during the transmit mode and biased off during the receive mode;
wherein the second port is electrically connected to each radiating element.

7. A phased array system in accordance with claim 6, wherein said receiver amplifier is a common source amplifier.

8. A phased array system in accordance with claim 6, wherein said transmitter amplifier is a common source amplifier.

9. A phased array system in accordance with claim 6, wherein said receiver amplifier further comprises a receiver electrode that is biased at a high voltage potential when the receiver amplifier is in the receive mode.

10. A phased array system am accordance with claim 6, wherein said transmitter amplifier further comprises a transmitter electrode that is biased at a high voltage potential when the transmitter amplifier is in the transmit mode.

11. A phased array system in accordance with claim 6, wherein said phased array system is one MMIC semiconductor wafer.

12. A phased array system in accordance with claim 6, wherein said receiver amplifier further comprises interstage matching networks optimized for low noise figure and said transmitter amplifier further comprises interstage matching networks optimized for high power output.

13. A phased array system in accordance with claim 6, further comprising a combining matrix that has at least one matrix input port and at least one matrix output port wherein the first port of said at least one bi-directional amplifier is electrically connected to said at least one matrix input port.

14. A phased array system in accordance with claim 13, wherein said at least one bi-directional amplifier is electrically connected to said at least one matrix output port said combining matrix.

* * * * *